US012742241B2

(12) United States Patent
Zheng et al.

(10) Patent No.: US 12,742,241 B2
(45) Date of Patent: Sep. 22, 2026

(54) HEATING APPARATUS, CVD EQUIPMENT INCLUDING THE HEATING APPARATUS

(71) Applicant: ADVANCED MICRO-FABRICATION EQUIPMENT INC. CHINA, Shanghai (CN)

(72) Inventors: Zhenyu Zheng, Shanghai (CN); Zhennan Xie, Shanghai (CN); Yong Jiang, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 1268 days.

(21) Appl. No.: 17/609,087

(22) PCT Filed: Jun. 5, 2020

(86) PCT No.: PCT/CN2020/089797

§ 371 (c)(1),
(2) Date: Nov. 5, 2021

(87) PCT Pub. No.: WO2020/244357

PCT Pub. Date: Dec. 10, 2020

(65) Prior Publication Data

US 2025/0179640 A1 Jun. 5, 2025

(30) Foreign Application Priority Data

Jun. 5, 2019 (CN) ......................... 201910486721.0
Feb. 17, 2020 (CN) ......................... 202010095741.8

(51) Int. Cl.
*C23C 16/46* (2006.01)
*C23C 16/458* (2006.01)
(Continued)

(52) U.S. Cl.
CPC .......... *C23C 16/46* (2013.01); *C23C 16/4584* (2013.01); *C23C 16/52* (2013.01); *C30B 25/10* (2013.01); *C30B 25/12* (2013.01)

(58) Field of Classification Search
CPC ......... C30B 25/10; C30B 25/12; C23C 16/46; C23C 16/4584; C23C 16/52
(Continued)

(56) References Cited

U.S. PATENT DOCUMENTS 6,080,970 A * 6/2000 Yoshida ............. H10P 72/0432 118/725
7,417,206 B2 * 8/2008 Nakamura .......... H10P 72/0432 219/544
(Continued)

FOREIGN PATENT DOCUMENTS

CN 101772837 A 7/2010
CN 103526183 A 1/2014
(Continued)

OTHER PUBLICATIONS

International Search Report mailed Aug. 10, 2020.
International Search Report Dated Aug. 10, 2020; International Application No. PCT/CN2020-089797; 5 pages total.

*Primary Examiner* — Charlee J. C. Bennett
(74) *Attorney, Agent, or Firm* — Womble Bond Dickinson (US) LLP

(57) ABSTRACT

Disclosed is a heating apparatus for heating a rotatable wafer susceptor so as to improve temperature uniformity of various zones of the top surface of the wafer susceptor. The wafer susceptor has a rotation axis; the heating apparatus is disposed beneath the wafer susceptor and vertically spaced a distance from the wafer susceptor. The heating apparatus includes one or more first heaters and a plurality of auxiliary heaters. The one or more first heaters are configured to heat ring-shaped zones of the wafer susceptor above, the plurality (Continued)

of auxiliary heaters are disposed beneath the ring-shaped zones, and the plurality of auxiliary heaters have different distances from the rotation axis so as to adjust a local temperatures in the ring-shaped zones.

25 Claims, 7 Drawing Sheets

(51) Int. Cl.
*C23C 16/52* (2006.01)
*C30B 25/10* (2006.01)
*C30B 25/12* (2006.01)

(58) Field of Classification Search
USPC .......................................................... 118/725
See application file for complete search history.

(56) References Cited

U.S. PATENT DOCUMENTS

| | | | | |
|---|---|---|---|---|
| 8,143,557 | B2 * | 3/2012 | Shibata | H05B 3/145 219/460.1 |
| 8,193,473 | B2 * | 6/2012 | Unno | H05B 3/143 118/725 |
| 11,672,376 | B2 * | 6/2023 | Song | H05B 3/748 219/443.1 |
| 2003/0062359 | A1 * | 4/2003 | Ho | H10P 72/0602 219/468.1 |
| 2003/0183616 | A1 * | 10/2003 | Goto | H05B 3/748 219/468.1 |
| 2006/0157472 | A1 * | 7/2006 | Mashima | H10P 72/0432 219/444.1 |
| 2013/0078375 | A1 * | 3/2013 | Krotov | C23C 14/541 118/724 |
| 2016/0247690 | A1 * | 8/2016 | Takahashi | H01L 21/68757 |
| 2018/0254204 | A1 * | 9/2018 | Jung | H10P 72/0432 |
| 2019/0244839 | A1 * | 8/2019 | Lindberg | H01L 21/324 |
| 2020/0063975 | A1 * | 2/2020 | Song | H05B 3/748 |
| 2020/0131636 | A1 * | 4/2020 | AuBuchon | C23C 16/45502 |
| 2021/0130958 | A1 * | 5/2021 | Wu | C30B 25/10 |

FOREIGN PATENT DOCUMENTS

| | | | |
|---|---|---|---|
| CN | 108728828 | A | 11/2018 |
| CN | 212128297 | U | 12/2020 |
| FR | 2616808 | A1 | 12/1988 |
| JP | H11191535 | A | 7/1999 |
| TW | 201839168 | A | 11/2018 |
| WO | 2018069387 | A1 | 4/2018 |

* cited by examiner

HEATING APPARATUS, CVD EQUIPMENT INCLUDING THE HEATING APPARATUS

RELATED APPLICATIONS

The present application is the national phase of International Application No. PCT/CN2020/089797, filed on Jun. 5, 2020 which claims priority to and the benefit of Chinese Patent Application No. 201910486721.0, filed on Jun. 5, 2019 and Chinese Patent Application No. 202010095741.8 filed Feb. 17, 2020, and the disclosures of which are hereby incorporated herein by reference in their entireties.

FIELD

Embodiments of the present disclosure relate to a heating apparatus, and more particularly relate to chemical vapor deposition (CVD) equipment including the heating apparatus.

BACKGROUND

Many semiconductor elements are fabricated by epitaxially growing a semiconductor material on a substrate by chemical vapor deposition (CVD). The substrate is basically a disc-shaped polycrystalline silicon material, generally referred to as wafer. During the fabrication process, the wafer usually sustains a high temperature and is exposed to an environment with one or more chemical precursors. The precursors may undergo a reaction or decomposition on the wafer surface to produce a desired deposit. The precursors for CVD generally include metals, e.g., metal hydrides, halides, halogen hydrides or organometallic compounds. The precursors will be bonded with carrier gas such as nitrogen without any noticeable reaction, wherein the carrier gas and undesired byproducts may be exhausted via a gas outlet of the reaction chamber.

MOCVD (Metal Organic Chemical Vapor Deposition) may be applied to continuously grow semiconductor compound layers to thereby fabricate devices formed by Group III and Group V semiconductor materials. Groups III and V semiconductor materials include light emitting diodes (LEDs) and other high performance wafers such as laser diodes, optical sensors, and field effect transistors. Such devices may be formed by reaction between an organic gallium compound and ammonia on for example sapphire or silicon substrates. When depositing gallium nitride and relevant compounds, the wafer maintains a temperature between 500° C. and 1200° C.; therefore, a heater assembly is generally utilized to heat till between 1000° C. and 2200° C. so as to reach the wafer process temperature. Besides, other process parameters such as pressure and gas flow rate need to be controlled to achieve a desired crystal growth process. After all semiconductor layers are formed and the electric contacts pass electrical tests, the wafer may be cut into individual elements.

Generally, a wafer susceptor in the MOCVD reactor simultaneously holds a plurality of wafers so as to enhance processing efficiency. This brings more severe challenges to the wafer susceptor heating system, i.e., the wafers in all zones of the wafer susceptor surface are required to be in an appropriate temperature range. Otherwise, those materials grown on the wafers in zones at inappropriate temperature are likely to have quality defections.

Current GaN mass-production MOCVD equipment is mainly applied to manufacture blue/green LED illuminators. The blue/green LED illuminators are less demanding on uniformity of light emission wavelength, where the wavelength uniformity is generally required to be less than 2 nm. However, with prospective applications of Mini-LED and micro-LED in high-end displays, an individual display generally requires a wavelength uniformity of less than +/−2 nm, which poses a higher requirement on wavelength uniformity, where the wavelength uniformity is required to be 0.8 nm or less, equivalent to controlling the temperature of the entire epitaxial wafer surface to be +/−0.1° C. for epitaxial growth at about 800° C. This poses a higher requirement on control of the global temperature of the wafer susceptor and on fine tuning of local temperature fields during the epitaxial growth process.

SUMMARY

In an aspect of the present disclosure, there is provided a heating apparatus for heating a rotatable wafer susceptor, the wafer susceptor having a rotation axis (OO'), the heating apparatus being disposed beneath the wafer susceptor and vertically spaced a distance from the wafer susceptor, wherein the heating apparatus comprises one or more first heaters and a plurality of auxiliary heaters, the one or more first heaters being configured to heat ring-shaped zones of the wafer susceptor above; the auxiliary heaters being disposed beneath the ring-shaped zones, and the plurality of auxiliary heaters having different distances from the rotation axis so as to tune local temperatures of the ring-shaped zones; each of the one or more first heaters includes: two first pin connectors; a first heating segment connecting the two first pin connectors and configured to heat the wafer susceptor, the first heating segment including a plurality of arc-shaped heating segments as well as connectors for connecting different arc-shaped heating segments; and each auxiliary heater includes: two auxiliary pin connectors; and an auxiliary heating segment connecting the two auxiliary pin connectors and configured to heat the wafer susceptor.

Optionally, area of the auxiliary heating segment in each auxiliary heater is less than that of the arc-shaped heating segment.

Optionally, the auxiliary heating segment is disposed beneath the first heating segment.

Optionally, radial positions of the auxiliary heaters correspond to intervals between adjacent first arc-shaped heating segments or intervals between adjacent first heaters.

Optionally, radial positions of a first group of auxiliary heaters of the auxiliary heaters correspond to intervals between adjacent arc-shaped heating segments or intervals between adjacent first heaters, and radial positions of a second group of auxiliary heaters in the auxiliary heaters correspond to the first arc-shaped heating segments.

Optionally, the first group of auxiliary heaters and the second group of auxiliary heaters are disposed on two sides of the rotation axis (OO'), respectively.

Optionally, radial width of at least one of the auxiliary heaters is less than or equal to width of the intervals between adjacent first arc-shaped heating segments.

Optionally, radial width of at least one of the auxiliary heaters is less than or equal to half a radial width of the ring-shaped zone.

Optionally, auxiliary heating zones are provided between a plurality of opposite connectors in the same first heating segment or between a plurality of opposite connectors across different first heating segments, the auxiliary heaters being located in the auxiliary heating zones.

Optionally, area of the auxiliary heating zones is less than 1/10 of the area of the wafer susceptor.

Optionally, the auxiliary heaters include first auxiliary heaters and second auxiliary heaters; distances from the first auxiliary heaters to the rotation axis (OO') are greater than distances from the second auxiliary heaters to the rotation axis (OO'), wherein the number of the first auxiliary heaters is greater than or equal to that of the second auxiliary heaters.

Optionally, heating power of the first heater is over 10 folds of that of the auxiliary heater.

Optionally, the auxiliary heaters include first auxiliary heaters and second auxiliary heaters; wherein distances from the first auxiliary heaters to the rotation axis (OO') are greater than distances from second auxiliary heaters to the rotation axis (OO'), and heating power of the first auxiliary heater is greater than or equal to that of the second auxiliary heater.

Optionally, the arc-shaped heating segments include first arc-shaped heating segments and second arc-shaped heating segments, wherein distances from the first arc-shaped heating segment to the rotation axis (OO') is greater than distance from the second arc-shaped heating segment to the rotation axis (OO'), and arc-shape length of the first arc-shaped heating segment is greater than arc-shape length of the second arc-shaped heating segment.

Optionally, the heating apparatus further comprises a thermal insulation portion, wherein the thermal insulation portion surrounds the auxiliary heaters and is configured to insulate thermal radiation of the first heating segments to the auxiliary heaters.

Optionally, the heating apparatus further comprises a second heater, wherein the second heater includes two second pin connectors, and second heating segments of the second heater are located at the periphery of the ring-shaped zone.

Optionally, cross-section area of the first pin connector is greater than 3 folds of the cross-section area of the auxiliary pin connector.

In another aspect of the present disclosure, there is provided MOCVD equipment, comprising: an airtight reaction chamber; a rotatable wafer susceptor disposed in the reaction chamber and configured to securely hold wafers on top surface of the wafer susceptor; the heating apparatus described above, wherein the heating apparatus is disposed beneath the wafer susceptor and vertically spaced a distance from the wafer susceptor, the heating apparatus being configured to heat the wafer susceptor.

Optionally, heating powers of different heaters and auxiliary heaters are independently controllable.

Optionally, a thermal insulative shielding plate is provided beneath the heating apparatus, a liquid cooling conduit is provided beneath the thermal insulative shielding plate, such that a cooling zone is provided underneath the thermal insulative shielding plate, wherein the first pin connectors and the auxiliary pin connectors run through the thermal insulative shielding plate to access the cooling zone below.

In a further aspect of the present disclosure, there is provided a heating apparatus for heating a rotatable wafer susceptor, the heating apparatus being disposed beneath the wafer susceptor and vertically spaced a distance from the wafer susceptor, the wafer susceptor having an rotation axis (OO'), wherein the heating apparatus comprises at least one continuous first heater and a plurality of auxiliary heaters, the first heater including: two first pin connectors; a first heating segment connecting the two pin connectors and configured to heat the wafer susceptor; the first heating segment including a plurality of first arc-shaped heating segments and a plurality of connectors for connecting different first arc-shaped heating segments; wherein distance from the utmost proximate end of the first arc-shaped heating segments to the rotation axis (OO') is denoted as $S_{min}$, and distance from the utmost distal end of the first arc-shaped heating segments to the rotation axis (OO') is denoted as $S_{max}$, and distances from the auxiliary heaters to the rotation axis (OO') are within the interval $[S_{min}, S_{max}]$; each auxiliary heater includes: two auxiliary pin connectors; and an auxiliary heating segment connecting the two pin connectors and configured to heat the wafer susceptor.

Here, the phrase "utmost proximal end" of the arc-shaped heating segments refers to the inner edge of the arc-shaped heating segment most proximate to the rotation axis. The "utmost distal end" of the arc-shaped heating segments refers to the outer edge of the arc-shaped heating segment most distal from the rotation axis.

In a further aspect of the present disclosure, there is provided an auxiliary heater for MOCVD equipment, the MOCVD equipment comprising: a rotatable wafer susceptor having an rotation axis (OO'); and a first heater, the first heater and the auxiliary heater being disposed beneath the wafer susceptor and vertically spaced a distance from the wafer susceptor, the first heater being configured to heat a ring-shaped zone of the wafer susceptor above, the auxiliary heater being disposed beneath the ring-shaped zone, wherein a plurality of the auxiliary heaters are provided and different auxiliary heaters have different distances from the rotation axis, wherein the auxiliary heaters are configured to adjust local temperatures of the ring-shaped zones, and the first heater comprises: two first pin connectors; and a first heating segment connecting the two first pin connectors and configured to heat the wafer susceptor, the first heating segment including a plurality of arc-shaped heating segments and connectors for connecting different arc-shaped heating segments.

Optionally, the auxiliary heater comprises: two auxiliary pin connectors; and an auxiliary heating segment connecting the two pin connectors and configured to heat the wafer susceptor.

Optionally, radial position of the auxiliary heater corresponds to intervals between adjacent first arc-shaped heating segments or intervals between adjacent first heaters.

Optionally, the auxiliary heater is at least partially surrounded by a thermal insulation portion, the thermal insulation portion being configured to insulate thermal radiation of the first heating segment to the auxiliary heater.

In a still further aspect of the present disclosure, there is provided a heating apparatus for heating a rotatable wafer susceptor, the wafer susceptor having an rotation axis (OO'), the heating apparatus being disposed beneath the wafer susceptor and vertically spaced a distance from the wafer susceptor, the heating apparatus includes a main heater and a plurality of auxiliary heaters, the main heater being configured to heat the wafer susceptor above, the plurality of auxiliary heaters having different distances from the rotation axis (OO'), each of the plurality of auxiliary heaters being configured to independently adjust local temperature in the zone heated by the main heater.

In another aspect of the present disclosure, there is provided MOCVD equipment, comprising: an airtight reaction chamber; a rotatable wafer susceptor disposed in the reaction chamber and configured to securely hold wafers on top surface of the wafer susceptor; and the heating apparatus described above, which is disposed beneath the wafer susceptor and vertically spaced a distance from the wafer susceptor, configured to heat the wafer susceptor.

In a further aspect of the present disclosure, there is provided a method for semiconductor processing using the MOCVD equipment stated above, comprising: placing a wafer on a wafer susceptor; activating a main heater to perform wafer processing; detecting process parameter distribution on wafer surface; adjusting an auxiliary heater to achieve a desired process parameter distribution.

In a further aspect of the present disclosure, there is provided an auxiliary heater for MOCVD equipment, the MOCVD equipment comprising: a rotatable wafer susceptor having an rotation axis (OO'); and a first heater, the first heater and the auxiliary heater being disposed beneath the wafer susceptor and vertically spaced a distance from the wafer susceptor, the first heater being configured to heat a ring-shaped zone of the wafer susceptor above, the auxiliary heater being disposed beneath the ring-shaped zone, wherein a plurality of the auxiliary heaters are provided and different auxiliary heaters have different distances from the rotation axis, wherein the auxiliary heater is configured to adjust local temperature in the ring-shaped zone, the first heater comprises: two first pin connectors; and a first heating segment connecting the two first pin connectors and configured to heat the wafer susceptor, the first heating segment including a plurality of arc-shaped heating segments and connectors for connecting different arc-shaped heating segments.

In a still further aspect of the present disclosure, there is provided an auxiliary heater for MOCVD equipment, the MOCVD equipment comprising: a rotatable wafer susceptor having an rotation axis (OO'); and a main heater, the main heater and the auxiliary heater being disposed beneath the wafer susceptor and vertically spaced a distance from the wafer susceptor, the main heater being configured to heat the wafer susceptor above, wherein a plurality of the auxiliary heaters are provided and different auxiliary heaters have different distances from the rotation axis (OO'), the auxiliary heater being configured to independently adjust local temperature in the zone heated by the main heater.

DETAILED DESCRIPTION

The apparatuses/components provided by the present disclosure may be applied to CVD equipment, particularly CVD equipment with a wafer susceptor (also referred to as "wafer carrier tray" in industry) for securely holding a wafer, wherein the wafer susceptor is rotating at a rotational speed during a deposition process so as to improve deposition quality. An example of such CVD equipment is MOCVD equipment. It is noted that the CVD equipment here should be understood broadly, including epitaxial growth equipment.

Hereinafter, a heating apparatus and MOCVD equipment including the heating apparatus according to the present disclosure will be explained with reference to the accompanying drawings. It is noted that the description is only exemplary, and other embodiments applying the present disclosure are possible. Moreover, the technical features in various embodiments may be combined in any manner.

Figure 1:
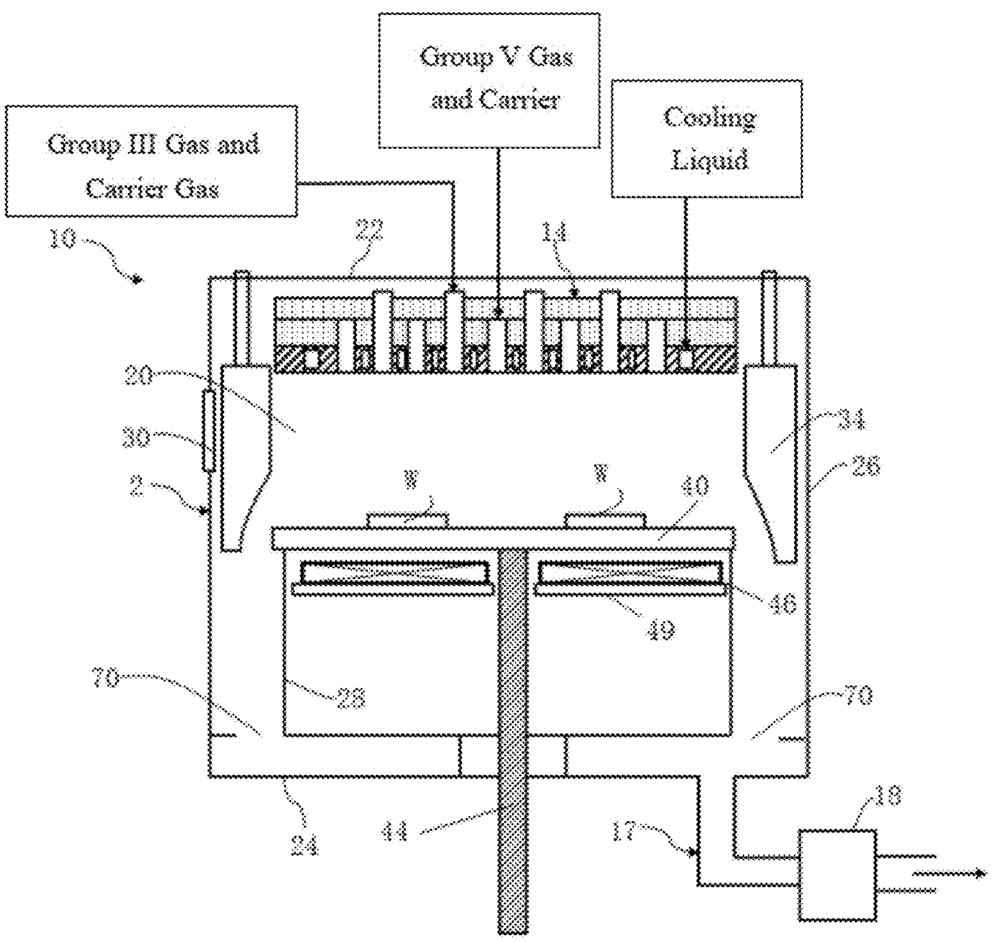
FIG. 1 is a structural schematic diagram of MOCVD equipment according to an embodiment of the present disclosure.

FIG. 1 is a structural schematic diagram of MOCVD equipment according to an embodiment of the present disclosure. As illustrated in FIG. 1, the MOCVD equipment 10 comprises a reaction chamber 2 having a gas inlet 14 and a gas outlet 17, wherein the gas inlet 14 may be disposed on the top of the reaction chamber 2, and the gas outlet 17 may be provided at the bottom of the reaction chamber 2.

The reaction chamber 2 has a top wall 22 disposed on the top, a bottom wall 24 at the bottom, and a cylindrical sidewall 26 extending between the top wall 22 and the bottom wall 24. The top wall 22, the bottom wall 24, and the sidewall 26 jointly enclose an airtight internal processing space 20 which may accommodate gases ejected from the gas inlet 14. Although the illustrated reaction chamber 2 is cylindrical, other embodiments may include alternative shapes of reaction chambers, for example, having a conical or alternative shape of revolution surface, such as square, hexagonal, octagonal, or any other appropriate shape.

The gas inlet 14 is connected with a gas source for supplying process gases applied during wafer processing. The process gases refer to for example a carrier gas and a reactant gas, wherein the reactant gas refers to for example metal organic compounds and source gas of Group V metal elements. In a typical MOCVD (Metal Organic Chemical Vapor Deposition) process, the carrier gas may be nitrogen, hydrogen, or a mixture of nitrogen and hydrogen; therefore, the process gases at the top surface of the wafer susceptor may mainly comprise nitrogen and/or hydrogen, with certain amounts of reactant gas compositions. The gas inlet 14 is configured to receive various types of gases and directing the process gases to flow in a substantially downward direction.

The gas inlet 14 may also be connected to a cooling system in which liquid circulation passes through a gas dispensing element, so as to maintain a desired temperature for elements during operation. Additionally, a similar cooling arrangement (not shown) may be provided so as to cool the walls of the reaction chamber 2 (including top wall 22, bottom wall 24, and sidewall 26).

The gas outlet 17 is configured to exhaust gases (including both reaction-produced waste gases and some gases not participating in the reaction) from the internal processing space 20 of the reaction chamber 2. The gas outlet 17 comprises a gas outlet 70 provided at or near the bottom of the reaction chamber 2, and a pump 18 or other vacuum source, which is disposed outside the reaction chamber 2 and communicates with the gas outlet 70 to provide gas flow dynamics.

The reaction chamber 2 is further provided with a wafer transfer port 30 for moving wafers in/out and an annular reaction chamber liner 34 that closely abuts the sidewall 26 and may move up and down in a direction along the sidewall 26. The reaction chamber liner 34 has an upper close position and a lower open position. Upon completion of wafer processing, the reaction chamber liner 34 may be moved downward (so as to be moved to the open position) to expose the wafer transfer port 30, such that the wafers may be removed via the wafer transfer port 30. A next batch of wafers to be processed may also be transferred in via the wafer transfer port 30. After the wafers are transferred in, the reaction chamber liner 34 may be moved upward (so as to be moved to the close position) to occlude the wafer transfer port 30, such that the internal processing space 20 is isolated from the wafer transfer port 30. At the close position, the region defined by the reaction chamber liner 34 assumes a symmetrical circular profile, and the wafer transfer port 30 is "concealed" behind the reaction chamber liner 34 from accessing the process gases, wherein the region that can be accessed by the process gases is the circumferential edge defined by the reaction chamber liner 34, which ensures uniformity of the overall process environment. An actuating mechanism (not shown) configured to control and drive up-down movement of the reaction chamber liner 34 may be of any type, e.g., a mechanical, electromechanical, hydraulic, or pneumatic actuator.

Although the illustrated reaction chamber liner 34 is cylindrical, other embodiments may include other shapes of reaction chamber liner, for example, a square, hexagonal, octagonal, or any other appropriate shape.

The reaction chamber 2 is further provided with a rotatable rotary shaft 44, a wafer susceptor 40 mounted on the top of the rotary shaft 44 and rotatable with the rotary shaft 44, a loading mechanism (not shown), and a heating apparatus 46, wherein the rotary shaft 44 is connected to a rotary actuating mechanism (not shown) such as a motor actuator, the rotary actuating mechanism being configured to actuate the rotary shaft 44 to rotate about its central axis. The rotary shaft 44 may also be provided with an internal cooling passage (not shown) extending substantially along the axial direction of the rotary shaft. The internal cooling passage may be connected with a cooling source such that a fluid coolant may be recirculated by running from the cooling source, through the cooling passage, and back to the cooling source.

Alternatively, the reaction chamber 2 may also be provided with a rotary cylinder, wherein the edge portion of the wafer susceptor is supported on the circumferential portion of the opening of the rotary cylinder, such that when the rotary cylinder rotates, the wafer susceptor is driven to rotate along therewith. The structural configuration of the rotary actuating mechanism is provided above, which will not be described in detail here.

The wafer susceptor 40 substantially has a disc shape, which may be made of a material that does not contaminate the MOCVD process and can withstand the high temperature experienced during the process, for example, graphite, silicon carbide, or other heat-resistant materials. A plurality of wafer holding and receiving portions (not shown) of substantially circular shape are provided on the top surface of the wafer susceptor 40, wherein each wafer holding and receiving portion is adapted for holding one wafer W. In an example, the wafer susceptor 40 may have a diameter ranging from about 400 mm to about 1000 mm.

The loading mechanism (not shown) can transfer the wafer susceptor 40 into the reaction chamber 2 via the wafer transfer port 30 so as to mount the wafer susceptor 40 to the top of the rotary shaft 44, and can also detach the wafer susceptor 40 from the rotary shaft 44 so as to remove the wafer susceptor 40 out of the reaction chamber 2 via the wafer transfer port 30.

The heating apparatus 46 is usually disposed on a thermal insulative shielding plate 49 beneath the wafer susceptor 40, mainly for thermally radiating the heat to the backside of the wafer susceptor 40. The heat applied to the backside of the wafer susceptor 40 may diffuse upward to be conducted to the backside of each wafer W via the wafer susceptor 40, and diffuse further upward through the wafer W to reach the top surface of the wafer W. A liquid cooling conduit is provided beneath the thermal insulative shielding plate 49, such that a cooling zone is formed underneath the thermal insulative shielding plate 49, wherein the first pin connectors and the auxiliary pin connectors of the heating apparatus for inputting power pass through the thermal insulative shielding plate 49 to reach the cooling zone below. The heat may also be radiated from the top surface of the wafer susceptor 40 and the top surface of the wafer W to cooler elements (e.g., the sidewall 26 and gas inlet 14 of the reaction chamber 2) in the reaction chamber 2. The heat may also be transferred from the top surface of the wafer susceptor 40 and the top surface of the wafer W to the process gases flowing above these surfaces. The reaction chamber 2 further comprises an outer liner 28 so as to reduce infiltration of the process gases into the region accommodating the heating apparatus 46 in the reaction chamber. In an exemplary embodiment, a heat shield (not shown) may be provided beneath the heating apparatus 46. For example, the heat shield is arranged parallel to the wafer susceptor 40 to facilitate directing upward diffusion of the heat from the heating apparatus 46 to the wafer susceptor 40, rather than downward diffusion to the bottom wall 24 at the bottom end of the reaction chamber 2.

Figure 2:
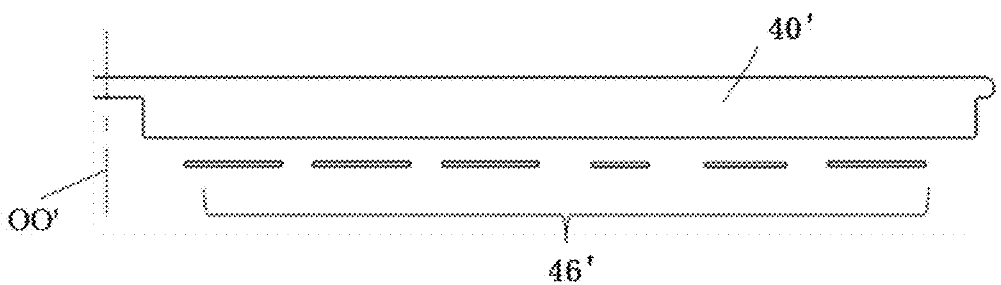
FIG. 2 and FIG. 3 are structural schematic diagrams of a conventional heating apparatus for heating a wafer susceptor.
Figure 3:
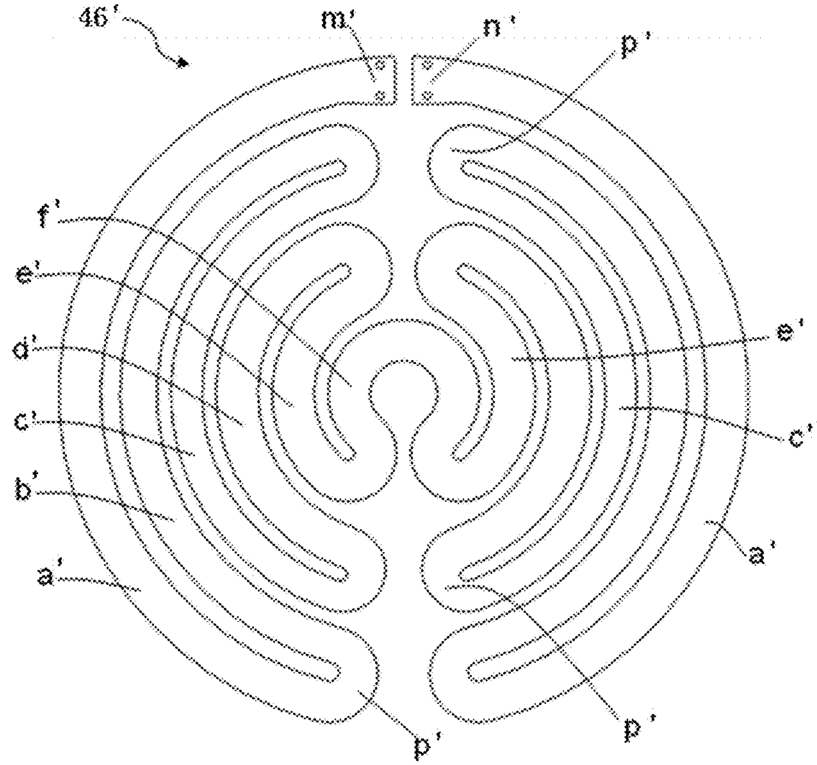

FIGS. 2 and 3 are structural schematic diagrams of a conventional heating apparatus, which may be applied in the MOCVD equipment shown in FIG. 1 such that a uniform temperature may be achieved at respective sites of the top surface of the wafer susceptor. As shown in FIG. 2 (due to limit of page width, FIG. 2 only shows a half structure including a wafer susceptor 40' and a heating apparatus. The wafer susceptor 40' and the heating apparatus are both of an axially symmetric structure; therefore, the illustrated half structure can substantially clearly indicate the structure of the heating apparatus and the relative positional relationship between the heating apparatus and the wafer susceptor 40') and FIG. 3, the heating apparatus is disposed beneath the wafer susceptor 40' and vertically spaced a distance from the wafer susceptor 40' so as to radiatively heat the wafer susceptor 40', wherein the heating apparatus includes a continuous heater 46'. The "continuous" heater mentioned herein and hereinafter refers to a single heater, in which multiple heating parts distributed in various sites and configured to convert electrical energy to thermal energy are electrically connected into a whole, such that the single heater can operate sufficiently when being connected to only one power supply.

The heater 46' as a whole is disposed on a same plane and includes a heating segment. The heating segment includes two pin connectors which are electrically connected to two terminals m', n' provided at the two ends of the heating segment. The two pin connectors are configured to electrically connect electrodes of a heating power supply (not shown), such that the heating power supply can be applied to the heater 46'. The heating segment includes a plurality of arc-shaped heating segments a', b', c', d', e', and f' which are distributed in a concentric pattern; and connectors p' for connecting adjacent arc-shaped heating segments. Circle centers of the arc-shaped heating segments a', b', c', d', e', and f' are all located at the rotation axis OO' of the wafer susceptor 40'.

To uniformly heat the lower surface of the wafer susceptor 40', one solution is to arrange a plurality of heaters 46', wherein each heater only covers a very small area and is electrically connected to an independent heating power supply. In other words, a plurality of heating zones, e.g., 3 or 4 zones, are partitioned, such that in cases of adjusting the temperature of a certain zone, it is only needed to adjust heating power of the heating power supply of the corresponding heater. Generally, the smaller the area covered by each heater, the more significant the improvement is. However, this solution requires adding more heating power supplies, which significantly increases costs. Additionally, due to increase of the number of heating power supplies, the circuitry connection between heaters and heating power supplies becomes more complex, and it is also difficult for the controller to automatically control powers of the heating power supplies.

Another solution is to arrange at least two arc-shaped heating segments in the heater 46', i.e., a first arc-shaped heating segment and a second arc-shaped heating segment, which have different unit length electrical resistivities (e.g., implemented by changing the width of the arc-shaped heating segment c). The difference in electrical resistivities is intended to improve temperature uniformity between respective zones of the wafer susceptor 40'. However, this solution has the following drawbacks: (1) to achieve a uniform temperature distribution, an exceptional heating segment must be replaced. However, replacement of the heating segment must be performed under machine shutdown; therefore, it is impossible to adjust temperature distribution of a sub-zone in real time during operation; (2) for each modification of the temperature distribution, a set of new heaters must be remade, and test and optimization must be performed before final setting. This undoubtedly increases costs and extends fabrication cycle.

The inventors of the present disclosure have been committed to overcoming the above drawbacks. Through researches and experiments, the inventors found that during wafer processing, the heaters were securely fixed on a thermal insulative shielding plate, while the wafer susceptor above the heaters are rotating about the rotation axis OO'. When a heater is disposed at any site on the thermal insulative shielding plate, the heating trajectory of the heater is a circle with a radius being the distance from the heater to the rotation axis. As the heater has a radial width, the actual zone heated thereby is also a ring-shaped zone. As such, the zone heated by each arc-shaped heating segment is also a ring-shaped zone, wherein the inner radius of the ring-shaped zone corresponds to the distance from the radial inner edge of the arc-shaped heating segment to the rotation axis, and the outer radius of the ring-shaped zone corresponds to the distance from the radial outer edge of the arc-shaped heating segment to the rotation axis. The zone heated by each connector is also a ring-shaped zone, which substantially covers a radial interval between adjacent arc-shaped heating segments. Therefore, when a mini-watt auxiliary heater is provided on the thermal insulative shielding plate, the auxiliary heater may adjust the temperature of the ring-shaped zone where it is located, wherein the ring-shaped zone refers to an area nearby the circumferential area with a radius being the distance from the auxiliary heater to the rotation axis. When the first heater and the auxiliary heater are both provided on the thermal insulative shielding plate, the first heater, due to its relatively large heating area, is configured to mainly control the heating temperature with respect to the wafer susceptor, while the auxiliary heater, based on the site it is disposed, may be configured to real-time continuously tune the temperature of the ring-shaped zone where it is located, thereby achieving local temperature control.

Based on the above idea, the inventors contemplate a heating apparatus for heating a rotatable wafer susceptor, the wafer susceptor having an rotation axis (OO'), the heating apparatus being disposed beneath the wafer susceptor and vertically spaced a distance from the wafer susceptor, wherein the heating apparatus includes one or more first heaters and a plurality of auxiliary heaters, the one or more first heaters being configured to heat ring-shaped zones of the wafer susceptor above, the auxiliary heaters being disposed beneath the ring-shaped zones, and the plurality of auxiliary heaters having different distances from the rotation axis, the plurality of auxiliary heaters being configured to adjust local temperatures of the ring-shaped zones; each of the one or more first heaters includes: two first pin connectors; and a first heating segment connecting the two first pin connectors and configured to heat the wafer susceptor, the first heating segment including a plurality of arc-shaped heating segments and connectors for connecting different arc-shaped heating segments; and each auxiliary heater includes: two auxiliary pin connectors; and an auxiliary heating segment connecting the two auxiliary pin connectors and configured to heat the wafer susceptor.

A ring-shaped zone is defined as such: assuming that the rotation axis (OO') runs vertically through the center O of the wafer susceptor, the inner radius of the ring-shaped zone is denoted as $S_{min}$, and the outer radius of the ring-shaped zone is denoted as $S_{max}$; the distance from each auxiliary heater to the rotation axis OO' of the wafer susceptor lies within the interval $[S_{min}, S_{max}]$.

Generally, a plurality of arc-shaped heating segments are circumferentially distributed beneath the wafer susceptor. Arc-shaped length of an outer arc-shaped heating segment is greater than arc-shaped length of an inner arc-shaped heating segment.

In an embodiment, auxiliary heating segments of the auxiliary heaters are disposed right under the arc-shaped heating segments, i.e., the auxiliary heaters are covered by the arc-shaped heating segments. The heating manner of the auxiliary heaters is to radiate heat to the first heaters and then radiate to the lower surface of the wafer susceptor. In other embodiments, the auxiliary heating segments of the auxiliary heaters have a height in flush with the height of the arc-shaped heating segments. Alternatively, the auxiliary heating segments of the auxiliary heaters have a height slightly lower than the height of the arc-shaped heating segments; and in such embodiments, the auxiliary heaters are not covered by the arc-shaped heating segments.

Heating powers of the auxiliary heaters and the first heaters are supplied by different heating power supplies; therefore, their output powers are independently controllable, so can their heating effects. For example, their heating powers differ in an order of 10 to 100 folds. The area projected by an auxiliary heating segment in the auxiliary heater onto the wafer susceptor is far less than the area projected by an arc-shaped heating segment onto the wafer susceptor, e.g., a difference in an order of 10 to 20 folds. Moreover, the area projected by an auxiliary heating segment is less than the area projected by any one of the arc-shaped heating segments.

When the wafer susceptor above the auxiliary heater is rotating, an auxiliary heater can heat the temperature in the area nearby the circumferential area with a radius being the distance from the auxiliary heater to the rotation axis OO'. By disposing auxiliary heaters at different distances from the rotation axis OO', they can heat the temperatures nearby the circumferential areas with different distances as the radii. Therefore, by setting the distance from an auxiliary heater to the rotation axis OO' within the interval $[S_{min}, S_{max}]$, the auxiliary heater can finely tune the temperature of a desired sub-zone within the whole ring-shaped zone heated by the first heater. Dependent on different needs, different numbers of auxiliary heaters may be provided, and different distances from these auxiliary heaters to the rotation axis OO' can also be set.

The distance from an auxiliary heater to the rotation axis OO' may be set to any value within the interval [$S_{min}$, $S_{max}$]. Moreover, as an auxiliary heater heats the temperature of the area nearby the circumferential area with a radius being the distance from the auxiliary heater to the rotation axis OO', the auxiliary heater may be provided at any position on the circumferential area. In other words, the auxiliary heaters are not necessarily arranged in a straight line along the radial direction; instead, the manner of their radial arrangement may be arbitrary.

In another embodiment, the present disclosure further provides a heating apparatus for heating a rotatable wafer susceptor, the wafer susceptor having an rotation axis (OO'), the heating apparatus being disposed beneath the wafer susceptor and vertically spaced a distance from the wafer susceptor, wherein the heating apparatus comprises a main heater and a plurality of auxiliary heaters, the main heater being configured to heat the wafer susceptor above, the plurality of auxiliary heaters having different distances from the rotation axis (OO'), each of the plurality of auxiliary heaters being configured to independently control a local temperature in the zone heated by the main heater.

The main heater comprises: a main heating segment that includes a plurality of arc-shaped heating segments. When the wafer susceptor is rotating, the plurality of auxiliary heaters are configured to heat the wafer susceptor, forming a plurality of auxiliary ring-shaped heating zones with different distances from the rotation axis, wherein the temperatures of the plurality of auxiliary ring-shaped heating zones are independently controllable so as to adjust local temperatures of the zone heated by the main heater.

Optionally, when the wafer susceptor is rotating, vertical projections of the arc-shaped heating segments on the wafer susceptor form a first ring-shaped zone, wherein vertical projection of at least one of the first auxiliary heater onto the wafer susceptor overlaps at least partially the first ring-shaped zone.

Optionally, when the wafer susceptor is rotating, vertical projections of the intervals between adjacent arc-shaped heating segments onto the wafer susceptor form a second ring-shaped zone, wherein the vertical projection of at least one of the first auxiliary heaters onto the wafer susceptor overlaps at least partially the second ring-shaped zone.

Figure 4:
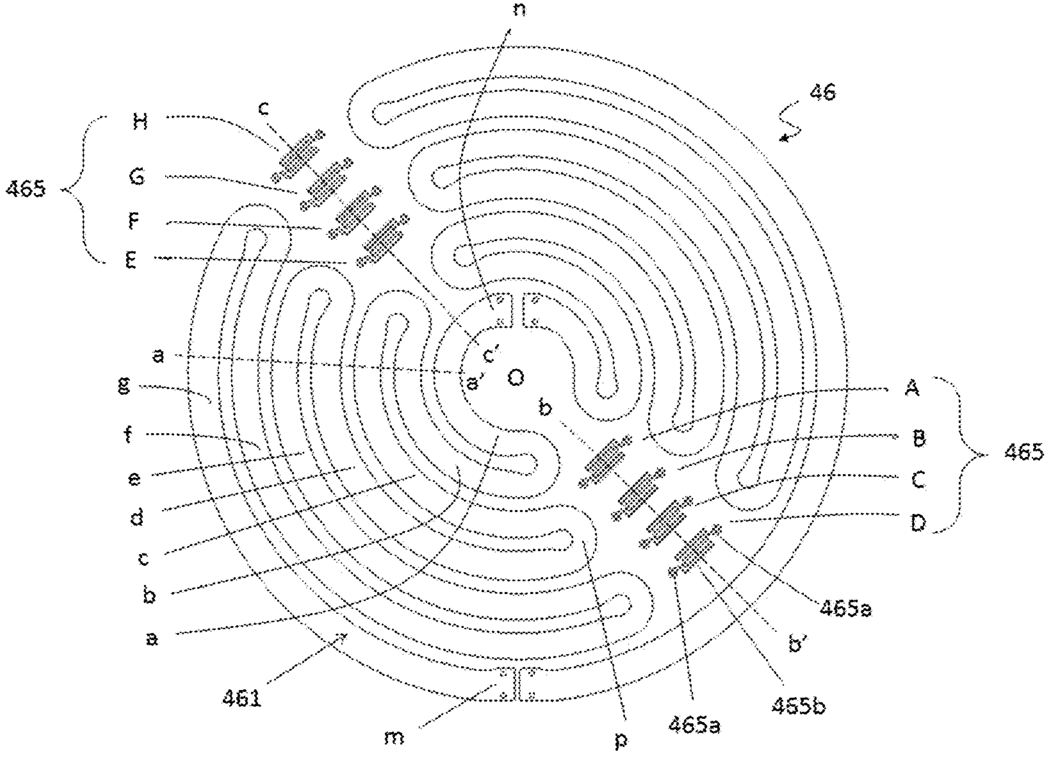
FIG. 4 and FIG. 5(*a*)~5(*c*) are structural schematic diagrams of a heating apparatus according to an embodiment of the present disclosure.
Figure 5:
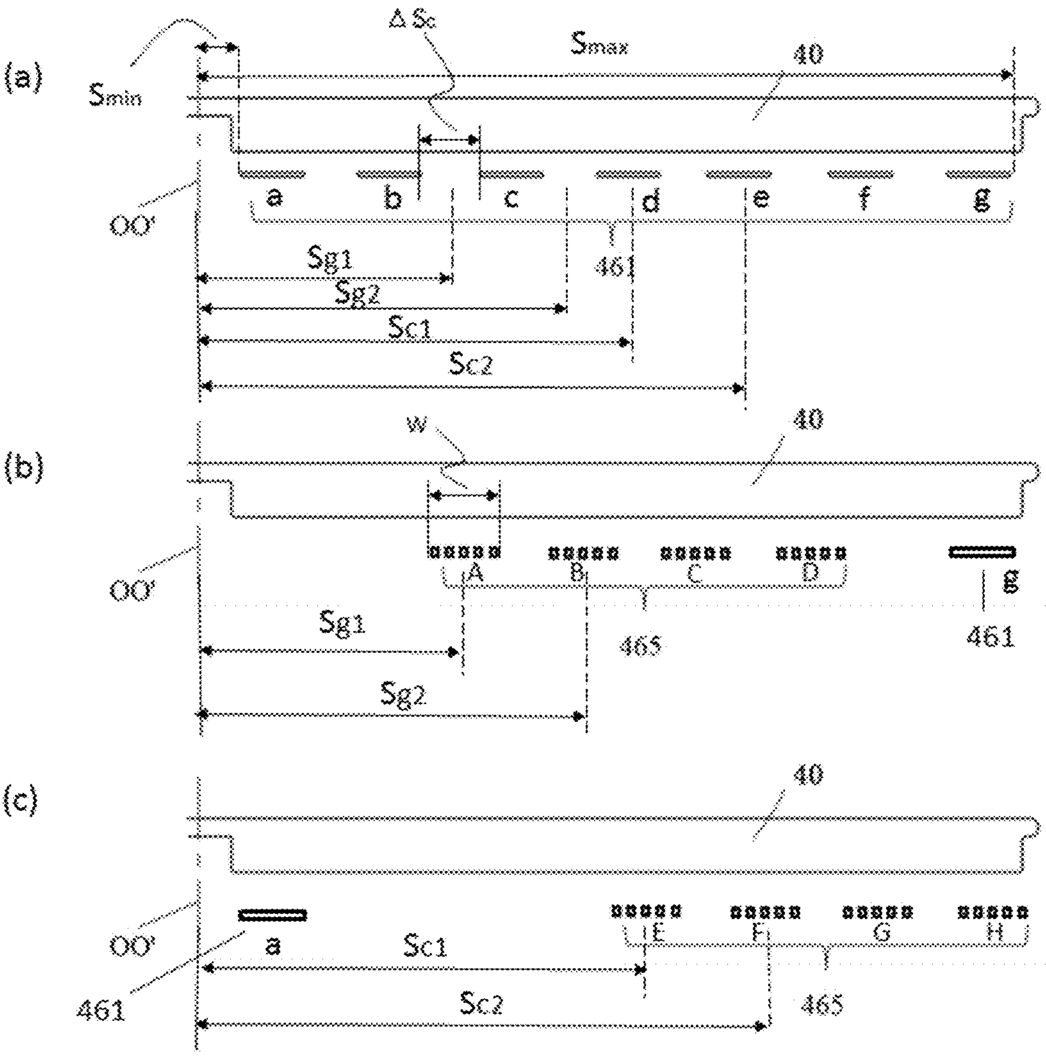

FIG. 4, FIG. 5(*a*), FIG. 5(*b*), and FIG. 5(*c*) are structural schematic diagrams of a heating apparatus according to an embodiment of the present disclosure, wherein FIG. 4 is a top view of the heating apparatus; FIGS. 5(A), 5(*b*), and 5(*c*) are sectional views of the wafer susceptor cut along the radial lines aa', bb', and cc' in FIG. 4, respectively. To facilitate understanding, these figures also illustrate relative position of the wafer susceptor 40. As illustrated in FIG. 4, FIG. 5(*a*), FIG. 5(*b*), and FIG. 5(*c*), the heating apparatus is disposed beneath the wafer susceptor 40 and is vertically spaced a distance from the wafer susceptor 40 so as to radially heat the wafer susceptor 40, wherein the heating apparatus 46 comprises a first heater 461 and auxiliary heaters 465. The first heater 461 includes a plurality of arc-shaped heating segments and connectors, which will be described later. In other embodiments, the first heater 461 may only include a plurality of arc-shaped heating segments, without connectors. Each auxiliary heater 465 includes: two auxiliary terminals 465*a*; an auxiliary heating section 465*b* connecting the two auxiliary terminals 465*a*; and two auxiliary pin connectors (not shown) electrically connected to the two auxiliary terminals 465*a*.

As illustrated in FIG. 4, the heating apparatus 46 includes two first heaters 461, but the number of arc-shaped heating segments of each first heater 461 is different from that of the heater 46' in FIG. 2 or FIG. 3. To explain briefly, the heating segments of the first heater 461 are sequentially denoted as a~g, respectively, and the eight auxiliary heaters 465 are denoted as A~H, respectively. It is seen that the arc-shaped length of an outer arc-shaped heating segment is greater than the arc-shaped length of an inner arc-shaped heating segment. As illustrated in FIG. 4 and FIG. 5(*a*), the distance from the inner edge of the innermost arc-shaped heating segment a to the rotation axis OO' is denoted as $S_{min}$, and the distance from the outer edge of the outermost arc-shaped heating segment h to the rotation axis OO' is denoted as $S_{max}$. $S_{min}$ and $S_{max}$ refer to the inner and outer radii of the ring-shaped zone, respectively. The distances from the auxiliary heaters A~H to the rotation axis OO' are all within the interval [$S_{min}$, $S_{max}$], i.e., the auxiliary heaters 465 are all disposed beneath the ring-shaped zones. In the embodiments illustrated in the figures, the auxiliary heaters 465 are sequentially arranged along the radial direction, and the heights of the auxiliary heaters are consistent with the heights of the arc-shaped heating segments a~h. In an alternative embodiment, the auxiliary heaters 465 may also be randomly arranged along the radial direction, as long as the respective auxiliary heaters 465 are all disposed beneath the ring-shaped zones, i.e., their distances from the rotation axis OO' are all within the interval [$S_{min}$, $S_{max}$]. In an alternative embodiment, the auxiliary heaters 465 are disposed right under the arc-shaped heating segments a~h.

Radial positions A~D of the auxiliary heaters correspond to the intervals between adjacent first arc-shaped heating segments or the intervals between adjacent first heaters. Specifically, FIG. 5(*a*) schematically illustrate the distances from the intervals between adjacent heating segments of the first heater 461 to the rotation axis OO'. For example, the distance from the interval between heating segments b, c to the rotation axis OO' is denoted as $S_{g1}$, the distance from the interval between heating segments c, d to the rotation axis OO' is denoted as $S_{g2}$, the distance from the heating segment d to the rotation axis OO' is denoted as $S_{c1}$, and the distance from the heating segment e to the rotation axis OO' is denoted as $S_{c2}$. As illustrated in FIG. 5(*b*), the positions of auxiliary heaters A-D are arranged as such: their distances from the rotation axis OO' correspond to the distances from the intervals between adjacent heating segments to the rotation axis. Specifically, the distance from the auxiliary heater A to the rotation axis OO' corresponds to $S_{g1}$, while the distance from the auxiliary heater B to the rotation axis OO' corresponds to $S_{g2}$; the arrangement relationships between auxiliary heaters C and D are derived as such. Such arrangements facilitate temperature adjustment above the intervals between adjacent heating segments. During a wafer fabrication process, the region above the circumferential areas where the arc-shaped heating segments are located can be effectively heated, while the regions above the circumferential areas where the intervals between adjacent arc-shaped heating segments are located can only be heated via the connectors; as the zone heated by a connector is far less than the zone heated by a heating segment, the region above the circumferential areas where the intervals are located cannot be effectively heated; further, because the connectors and the arc-shaped heating segments are connected integrally such that they cannot be heated independently, their radial heating effect is not uniform. In this embodiment, the distances from the auxiliary heaters A~D to the rotation axis OO' correspond to the distances from the intervals between adjacent heating segments to the rotation axis; besides, the auxiliary heaters A-D and the first heater 461 are powered separately, thereby effectively compensating the heating effect of the region above the circumferential areas where these intervals are located or effectively controlling the temperature of the region above the intervals. In another embodiment, the distances from the auxiliary heaters from the rotation axis OO' further correspond to the intervals between adjacent first heaters.

It is noted that in the present disclosure, the phrase "radial" refers to the direction perpendicular to the rotation axis OO', such that the radially arranged heaters may be disposed on the same plane or on different planes. The phrase "distance from an interval to the rotation axis OO'" refers to the distance from the radial central point of the interval to the rotation axis OO'. The phrase "distance from an auxiliary heater to the rotation axis OO'" refers to the distance from the radial central point of the auxiliary heater to the rotation axis OO'. The phrase "distance from a heating segment to the rotation axis OO'" refers to the distance from the radial central point of the heating segment to the rotation axis OO'. The phrase "corresponding to" refers that the distance from an auxiliary heater to the rotation axis is equal to the distance from an arc-shaped heating segment of the first heater to the rotation axis or to the distance from an interval between arc-shaped heating segments to the rotation axis, or the difference between the distance from an auxiliary heater to the rotation axis and the distance from an arc-shaped heating segment of the first heater or an interval between arc-shaped heating segments to the rotation axis is less than 5%, or the difference between the distance from an auxiliary heater to the rotation axis and the distance from an arc-shaped heating segment of the first heater or an interval between arc-shaped heating segments to the rotation axis is equal to or less than 10 mm, or equal to or less than 15 mm, or equal to or less than 17 mm.

The auxiliary heaters 465 may also be arranged at other radial positions. For example, as illustrated in FIG. 5(*c*), the distances from the auxiliary heaters E~H to the rotation axis OO' correspond to the distances from the heating segments d, e, f, g to the rotation axis OO'. Specifically, the distance from the auxiliary heater E to the rotation axis OO' corresponds to $S_{c1}$, while the distance from the auxiliary heater F to the rotation axis OO' corresponds to $S_{c2}$; the arrangement relationships between auxiliary heaters G and H are derived as such. Such arranged auxiliary heaters may adjust the zones above the circumferential areas where the arc-shaped heating segments are located.

It is noted that the auxiliary heaters A~H only schematically indicate the positions relative to the rotation axis OO'. The number, positions, and sizes of these auxiliary heaters may vary dependent on process and space requirements.

In another embodiment, it is allowed that only the auxiliary heaters A~D or only the auxiliary heaters E-H are arranged. These auxiliary heaters may be arranged at one side of the rotary shaft, or arranged separately at both sides thereof.

As illustrated in FIG. 4, the auxiliary heating segment 465*b* of the auxiliary heater is arranged in a serpentine and circulating manner along the tangent direction of the wafer susceptor. The radial width of the whole heating segment is denoted as W. In an embodiment, the radial width W is less than or equal to the radial width $\Delta S_c$ of the interval between adjacent heating segments (as shown in FIGS. 5(*a*) and 5(*b*)). Such arrangement enables the auxiliary heaters to provide a more accurate adjustment to the temperatures of the zones above the circumferential area where the intervals between arc-shaped heating segments are located. In another embodiment, the radial width W of at least one auxiliary heater is less than or equal to $(S_{max}-S_{min})/2$, i.e., less than or equal to half of the radial width of the ring-shaped zone.

The auxiliary heating segment 465*b* of the auxiliary heater may also have other shapes, e.g., arranged in a serpentine and circulating manner along the tangent direction of the wafer susceptor, or having a helical shape, etc.

Heating power of the first heater 461 is greater than heating power of the auxiliary heater 465 configured to adjust the temperature in the region heated by the first heater 461. Generally, the heating power of the first heater 461 is over 10 folds of the heating power of the auxiliary heater 465, e.g., 20 folds, 30 folds, 100 folds, etc. In an embodiment, the heating power of the first heater 461 may reach 100 KW, while the heating power of the auxiliary heater 465 is about 1000 W. In another embodiment, as the size of the heated area in the outer ring is greater than the size of the heated area in the inner ring, the heating power of the auxiliary heater 465 having a larger distance from the rotation axis OO' is greater than the heating power of the auxiliary heater 465 having a smaller distance from the rotation axis OO'. For example, in FIG. 4, the heating power of the auxiliary heater C is greater than the heating power of the auxiliary heater B, while the heating power of the auxiliary heater B is greater than the heating power of the auxiliary heater A.

In an embodiment, auxiliary heating zones are arranged between a plurality of opposite connectors P of a plurality of heating segments 461, and the auxiliary heaters 465 are located in the auxiliary heating zones. Optionally, the size of the auxiliary heating zones is less than 1/10 of that of the wafer susceptor. In other embodiments, if the first heater only has one continuous arc-shaped heating segment, the auxiliary heating zones may be provided between a plurality of opposite connectors P of the continuous arc-shaped heating segment.

Hereinafter, a plurality of embodiments regarding the heating apparatus according to the present disclosure will be illustrated.

Figure 6:
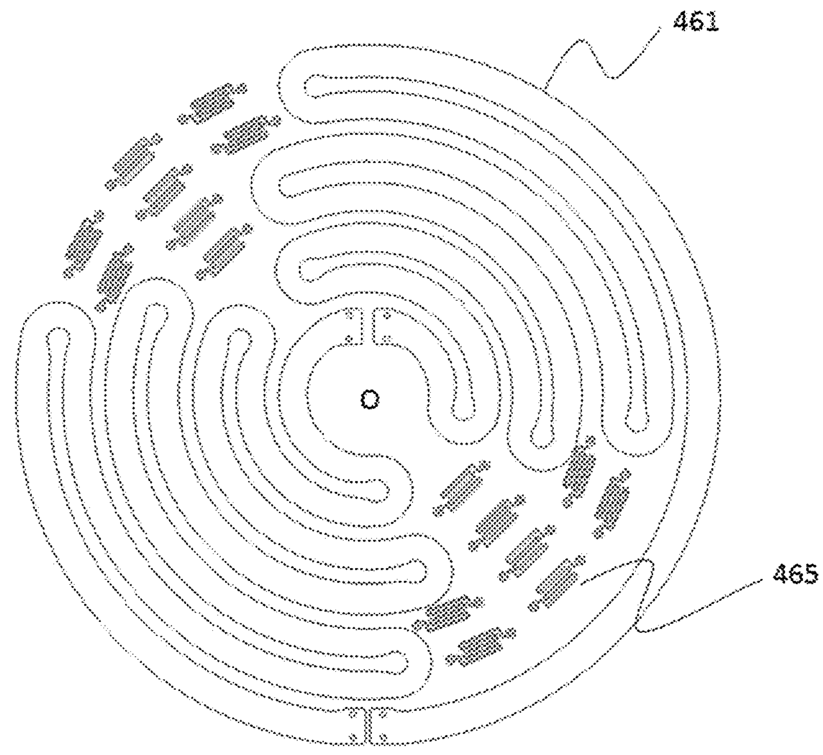
FIGS. 6~10 are structural schematic diagrams of a heating apparatus according to other embodiments.

FIG. 6 is a structural schematic diagram of the heating apparatus according to another embodiment of the present disclosure. Different from the embodiment shown in FIG. 4, in this embodiment, different numbers of auxiliary heaters 465 are arranged on circumferential areas with different distances from the rotation axis OO'. More auxiliary heaters 465 are provided on outer circumferential areas than inner circumferential areas, because the heated area in the outer circumferential areas is larger, requiring more auxiliary heaters 465 to perform temperature adjustment.

Figure 7:
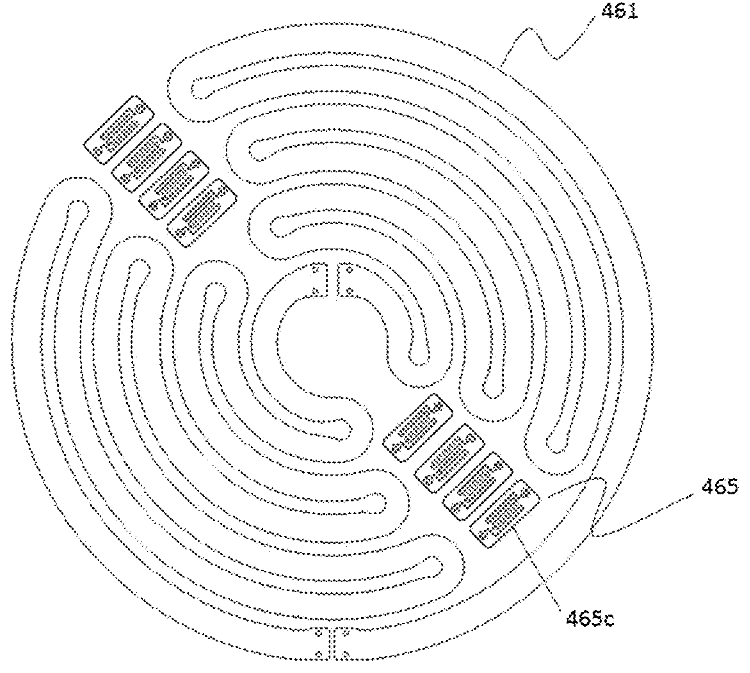

FIG. 7 is a structural schematic diagram of the heating apparatus according to another embodiment of the present disclosure. To insulate thermal radiation of the first heating segment to the auxiliary heater 465, in this embodiment, the auxiliary heater 465 further comprises a thermal insulation portion 465*c*, the thermal insulation portion 465*c* being arranged surrounding the auxiliary heating segments, which can effectively insulate thermal radiation of the first heating segment 461, such that the heating from the auxiliary heaters can be effectively applied to the wafer susceptor, and the auxiliary heater offers a more accurate temperature adjustment.

Figure 8:
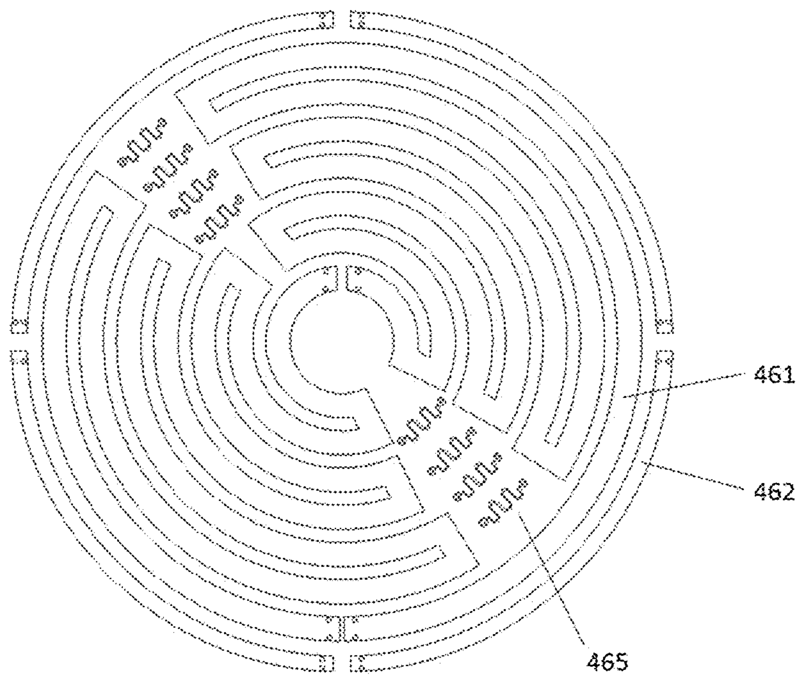

FIG. 8 is a structural schematic diagram of the heating apparatus according to another embodiment of the present disclosure. In this embodiment, the heating apparatus 46 may further comprise a second heater 462, wherein both ends of the second heater 462 are electrically connected with electrodes of another heating power supply (not shown). The second heater 462 is disposed at the outer circumferential area of the first heater 461, surrounding the first heater 461, so as to heat the outermost edge region of the wafer susceptor 40. The second heater 462 may be of a single-circle or multi-circle arc-shaped structure, or a ½ or ¼ arc-shaped structure. The thickness and material of the second heater 462 may be identical to those of the first heater 461. The width of the second heater 462 is far less than the widths of respective parts of the first heater 461, so as to provide a higher heating power. In this embodiment, the first heater 461 and the second heater 462 are powered by different heating power supplies (not shown), such that they can be individually controlled without mutual interference. To facilitate uniform support, the second heater 462 and the first heater 461 may be provided in the same plane, as shown in FIG. 8. It is noted that in this embodiment, the auxiliary heater 465 is similar to that shown in FIGS. 5-7, except that the auxiliary heating segments in the auxiliary heater 465 have a different arrangement manner. In this embodiment, the auxiliary heating segments are arranged to circulate along the radial direction, while the auxiliary heating segments of the auxiliary heater in FIGS. 5~7 are arranged to circulate along the circumferential direction. All of these auxiliary heaters play a role of adjusting local temperatures in the heated zones where the first heater 461 and the second heater 462 are located.

Figure 9:
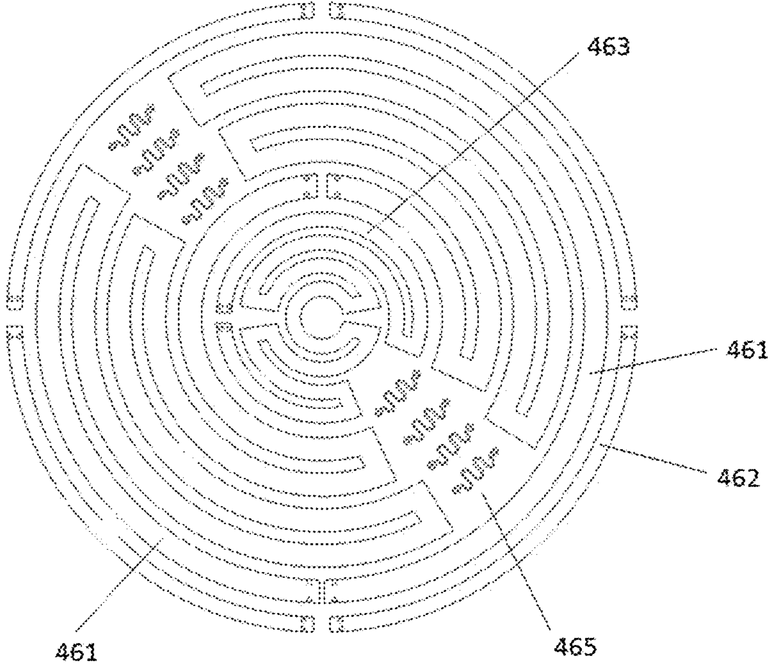

FIG. 9 is a structural schematic diagram of the heating apparatus according to another embodiment of the present disclosure. In this embodiment, the heating apparatus 46 may comprise a plurality of different first heaters, e.g., a first heater 461 and a first heater 463, wherein both ends of the first heater 463 are electrically connected to electrodes of another heating power supply (not shown). The first heater 463 is disposed beneath the central area of the wafer susceptor. The specific structure of the first holder 463 is similar to the first heater 461, including a heating segment which comprises a plurality of arc-shaped heating segments and connectors for connecting adjacent arc-shaped heating segments. The thickness and material of the first heater 463 may be identical to those of the first heater 461. The width of the first heater 463 is far less than the widths of respective parts of the first heater 461, so as to provide a higher heating power. The first heater 463 is configured to independently control the temperature of the central area of the wafer susceptor.

The first heater, the second heater, and the auxiliary heaters in the heating apparatus according to the present disclosure have been described above, and those skilled in the art may further contemplate other heaters or heating segments. For example, these heaters may heat in an inductive manner or in a resistive manner. The heating powers of the first heater, the second heater, and the auxiliary heaters in the present disclosure are independently controllable. For example, the heating powers are supplied by different heating power supplies. Alternatively, the heating powers of these heaters and auxiliary heaters are supplied by the same heating power supply, and the power output of the same heating power supply is divided into multiple routes, supplied to different heaters and auxiliary heaters, wherein the heating powers distributed to respective routes are adjustable.

The heating apparatus 46 comprises a first heater 461 and/or a second heater 462 and auxiliary heaters 465; wherein the first heater 461 and the second heater 462 serve as main heaters in the present disclosure, configured to heat the wafer susceptor. The auxiliary heaters are configured to heat the wafer susceptor and form a plurality of auxiliary ring-shaped heating zones with different distances from the rotation axis OO' of the wafer susceptor, wherein the temperatures of the plurality of auxiliary ring-shaped heating zones are independently controllable so as to adjust local temperatures of the zone heated by the main heater.

Figure 10:
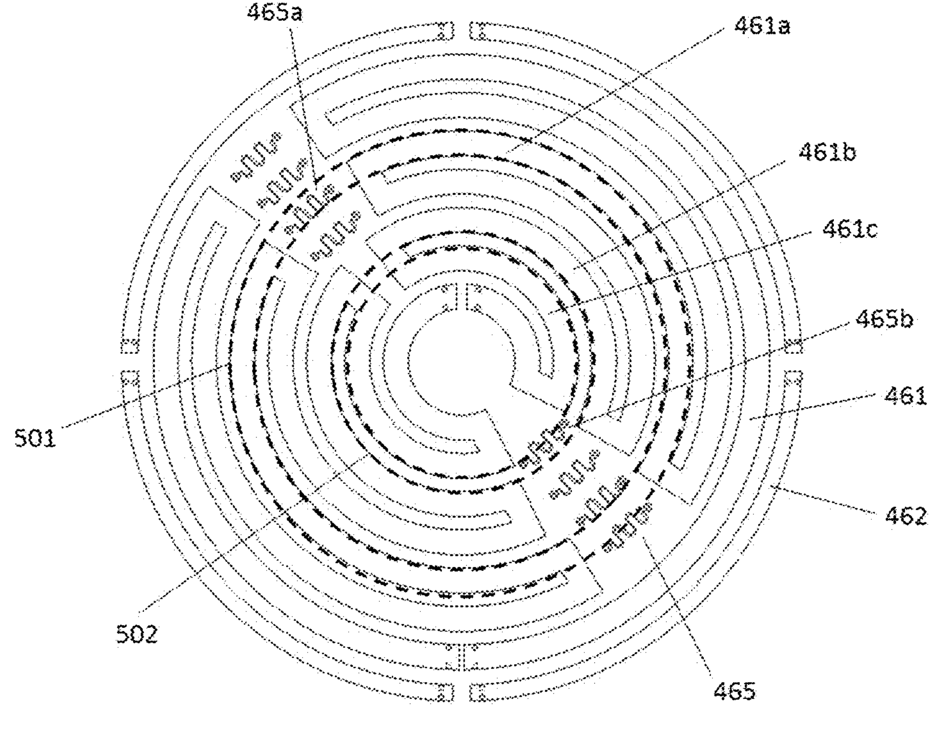

FIG. 10 is a structural schematic diagram of the heating apparatus according to another embodiment of the present disclosure. In this embodiment, the heating apparatus is disposed beneath the wafer susceptor, and the heating apparatus comprises main heaters 461, 462 and auxiliary heaters 465. The main heaters 461, 462 are configured to heat the wafer susceptor above, and the plurality of auxiliary heaters 465 are arranged and distributed along the radial direction of the wafer susceptor till the rotation axis OO' of the wafer susceptor, wherein each auxiliary heater 465 is configured to independently control a local temperature in a region heated by the main heaters 461, 462. The plurality of auxiliary heaters 465 are arranged in a straight line along the radial direction of the wafer susceptor, as shown in FIG. 10. Alternatively, the plurality of auxiliary heaters 465 may also be discretely arranged with any angle of orientation along the radial direction of the wafer susceptor. For example, the auxiliary heaters 465 are arranged in a radially stagger manner, or, the trajectory of the radial layout of the auxiliary heaters 465 is arc-shaped. It is noted that the auxiliary heaters may also be provided between the two main heaters in the outermost circle. The main heaters 461, 462 and the auxiliary heaters 465 are arranged on a same plane. Optionally, the main heaters 461, 462, and the auxiliary heaters 465 may also be arranged on different planes, i.e., the distances from the main heaters 461, 462 to the wafer susceptor are different from the distances from the auxiliary heaters 465 to the wafer susceptor. Optionally, the auxiliary heaters 465 can also be disposed right under the main heaters 461, 462, i.e., the vertical projection of the auxiliary heaters 465 on the wafer susceptor overlaps or at least partially overlaps the vertical projection of the main heater on the wafer susceptor.

In this embodiment, as illustrated in FIG. 10, the main heater 461 comprises a plurality of arc-shaped heating segments 461*a*, 461*b*, 461*c*, wherein connectors are provided between the plurality of arc-shaped heating segments 461*a*, 461*b*, 461*c* to connect the arc-shaped heating segments. When the wafer susceptor is rotating above the main heater 461, the vertical projection of the arc-shaped heating segment 461*a* on the wafer susceptor forms a first ring-shaped zone 501, the vertical projection of the auxiliary heater 465*a* on the wafer susceptor at least partially overlaps the first ring-shaped zone 501, such that the auxiliary heater 465*a* mainly adjusts the temperature of the first ring-shaped zone 501. Most preferably, the auxiliary heater 465*a* is located in the first ring-shaped zone 501, such that the auxiliary heater 465*a* can effectively adjust the temperature of the local area. Optionally, the radial center of the auxiliary heater 465*a* may radially offset a distance from the radial center of the first ring-shaped zone 501, wherein the offset distance lies in a scope of less than 20 mm, optionally less than 15 mm, or less than 10 mm. The present disclosure has no limitation thereto, and the specific scope of offset distance depends on situations.

An interval is provided between the arc-shaped heating segment 461*b* and the arc-shaped heating segment 461*c*, such that when the wafer susceptor is rotating above these arc-shaped heating segments, the vertical projection of the interval on the wafer susceptor forms a second ring-shaped zone 502, the vertical projection of the auxiliary heater 465*b* on the wafer susceptor at least partially overlaps the second ring-shaped zone 502, such that the auxiliary heater 465*b* mainly adjusts the temperature of the second ring-shaped zone 502. Most preferably, the auxiliary heater 465*b* is located in the second ring-shaped zone 502, such that the auxiliary heater 465*b* can effectively adjust the temperature of the local area. Optionally, the radial center of the auxiliary heater 465*b* may radially offset a distance from the radial center of the second ring-shaped zone 502, wherein the scope of the offset distance is less than 20 mm, optionally less than 15 mm, or less than 10 mm. The present disclosure has no limitation thereto, and the specific scope of offset distance depends on situations.

In this embodiment, the auxiliary heaters 465 are divided into two groups: the vertical projections of the four auxiliary heaters in the first group on the wafer susceptor are located in a plurality of ring-shaped zones formed by the vertical projections of the main heating segments on the wafer susceptor, respectively. The vertical projections of the four auxiliary heaters in the second group on the wafer susceptor are located in a plurality of ring-shaped zones formed by the vertical projections of the intervals between adjacent main heating segments on the wafer susceptor, respectively. The two groups of auxiliary heaters are arranged at both sides of the rotation axis (OO') of the wafer tray. The present disclosure has no limitation thereto, and specific arrangements are dependent on situations.

Optionally, the heating apparatus further comprises an actuating device connected to the auxiliary heaters, wherein the actuating device activates any one of the auxiliary heaters to move along the radial direction of the wafer susceptor or along the direction of the rotation axis (OO') so as to adjust different local temperatures on the wafer susceptor based on actual process requirements.

Optionally, the heating apparatus further comprises a power controller connected to the auxiliary heaters, wherein the power controller is configured to adjust the heating power of any one of the auxiliary heaters so as to adjust different local temperatures on the wafer susceptor based on actual process requirements. The heating apparatus further comprises a main power controller connected to the main heaters so as to control heating power of the main heaters, a plurality of first pin connectors and a plurality of auxiliary pin connectors of the main heaters and the auxiliary heaters run downward through the thermal insulative shielding plate so as to be electrically connected to their respective power controllers beneath the thermal insulative shielding plate.

Optionally, the auxiliary heaters 465 and the main heaters 461, 462 have different heating powers. For example, the actual heating power of the main heaters 461, 462 is over 15 or 20 folds of the actual heating power of the auxiliary heaters.

Optionally, the main heaters 461, 462 may heat in an inductive manner or in a resistive manner. The auxiliary heaters 465 may also heat in an inductive manner or in a resistive manner. For example, the heating in the inductive manner includes RF coil heating; the resistive manner includes hot plate heating, heating wire heating, or lamp heating.

The materials of the arc-shaped heating segments and the connectors in the main heaters 461, 462 may include refractory metals, graphite, tungsten, molybdenum, rhenium, tantalum, niobium and zirconium, or their combinations, or alloys, super alloy materials, silicon carbide and the like. The surfaces of the arc-shaped heating segments and connectors and the surfaces of the auxiliary heating segments are at least partially covered with the refractory metals or alloys, or high temperature-resistant coating materials such as boron nitride, tantalum carbide and silicon carbide.

The auxiliary heaters in the present disclosure offer the following advantages:

After long-term use of the heater assembly, relevant components such as the thermal insulation shields, heater supporters, and conduction electrodes will be deposited with reaction products, or the crystalline grains of the materials will grow too big, causing changes to material properties, affecting work performance of heaters, causing performance drift of the MOCVD process, and deteriorating the instability, which need to be solved by replacing relevant heater parts. The MOCVD reaction chamber assembly also deteriorates or is surface modified after long-term use, causing changes to the radiative heating environment of the heater, further causing performance drift of the MOCVD process, which requires real-time adjustment of process parameters and frequent cleaning and maintenance to the reaction chamber. The present disclosure enables compensation to temperature distribution changes by adjusting the power of auxiliary heaters without changing the arc-shaped heating segments in the main heaters; therefore, the present disclosure offers a simple and convenient operation, saves cost, and improves machine utilization.

Different wafer susceptors (due to different wafer sizes and layout manners) always have different temperature distribution requirements. A typical practice is to adopt different sizes of main heating segments for different temperature distributions, such that a set of main heating segments need to be changed when replacing a wafer susceptor. The present disclosure enables adaptation to different temperature distribution requirements by finely tuning the power output of auxiliary heaters. Therefore, the present disclosure offers a strong adaptability, a good adjustability, and a high adjustment precision.

As the auxiliary heater has a relatively small size, the local temperature distribution can be adjusted conveniently and more accurately by changing positions of the auxiliary heaters relative to the main heating segments and the wafer susceptor.

The present disclosure further discloses a method for semiconductor processing using MOCVD equipment stated above, the method comprising: placing a wafer on a wafer susceptor; activating a main heater to perform wafer processing; detecting process parameter distributions on wafer surface; and tuning an auxiliary heater to achieve a desired process parameter distribution. Optionally, the process parameters include wafer surface temperature and/or heat radiation wavelength. Adjusting the auxiliary heater may include any one of the following: moving the auxiliary heater along a radial direction of the wafer susceptor, moving the auxiliary heater along the rotation axis (OO'), and adjusting heating power of the auxiliary heater.

Although the contents of the present disclosure have been described in detail through the foregoing preferred embodiments, it should be understood that the depictions above shall not be regarded as limitations to the present disclosure. After those skilled in the art having read the contents above, many modifications and substitutions to the present disclosure are all obvious. Therefore, the protection scope of the present disclosure should be limited by the appended claims.

We claim:

1. A heating apparatus for heating a wafer susceptor, the wafer susceptor having a rotation axis, the heating apparatus being disposed beneath the wafer susceptor and vertically spaced a distance from the wafer susceptor, the heating apparatus comprising:

a main heater configured to heat the wafer susceptor above;

a plurality of auxiliary heaters, each of the plurality of auxiliary heaters including two auxiliary pin connectors, wherein the plurality of auxiliary heaters are capable of moving along a radial direction of the wafer susceptor or along a direction of a rotation axis; and a thermal insulation portion, wherein the thermal insulation portion surrounds the plurality of auxiliary heaters to transfer heat of the plurality of auxiliary heaters to the wafer susceptor;

wherein the plurality of auxiliary heaters have different distances from the rotation axis, and each of the plurality of auxiliary heaters is configured to independently adjust a local temperature of a zone heated by the main heater.

2. The heating apparatus according to claim 1, wherein the plurality of auxiliary heaters are arranged in a straight line.

3. The heating apparatus according to claim 1, wherein a distance from an auxiliary heater of the plurality of auxiliary heaters to the wafer susceptor is equal to or different from a distance from the main heater to the wafer susceptor.

4. The heating apparatus according to claim 1, wherein the main heater includes a main heating segment, the main heating segment including a plurality of arc-shaped heating segments.

5. The heating apparatus according to claim 1, wherein when the wafer susceptor is rotating, the plurality of auxiliary heaters are configured to heat the wafer susceptor, forming a plurality of auxiliary ring-shaped heating zones having different distances from the rotation axis, wherein temperatures of the plurality of auxiliary ring-shaped heating zones are independently controllable to adjust local temperatures of the zone heated by the main heater.

6. The heating apparatus according to claim 4, wherein when the wafer susceptor is rotating, vertical projections of the plurality of arc-shaped heating segments onto the wafer susceptor form a first ring-shaped zone, and vertical projection of at least one of the plurality of auxiliary heaters onto the wafer susceptor at least partially overlaps the first ring-shaped zone.

7. The heating apparatus according to claim 4, wherein when the wafer susceptor is rotating, vertical projections of intervals between adjacent arc-shaped heating segments onto the wafer susceptor form a second ring-shaped zone, and vertical projection of at least one of the plurality of auxiliary heaters onto the wafer susceptor at least partially overlaps the second ring-shaped zone.

8. The heating apparatus according to claim 4, wherein a radial position of at least one of the plurality of auxiliary heaters corresponds to that of an interval between adjacent arc-shaped heating segments.

9. The heating apparatus according to claim 4, wherein a radial position of at least one of the plurality of auxiliary heaters corresponds to that of an arc-shaped heating segment of the plurality of arc-shaped heating segments.

10. The heating apparatus according to claim 4, wherein radial positions of a first group of auxiliary heaters of the plurality of auxiliary heaters correspond to those of intervals between adjacent arc-shaped heating segments, and radial positions of a second group of auxiliary heaters of the plurality of auxiliary heaters correspond to those of the plurality of arc-shaped heating segments.

11. The heating apparatus according to claim 10, wherein the first group of auxiliary heaters and the second group of auxiliary heaters are located on two sides of the rotation axis, respectively.

12. The heating apparatus according to claim 4, wherein radial width of at least one of the plurality of auxiliary heaters is greater than a width of an interval between adjacent arc-shaped heating segments.

13. The heating apparatus according to claim 4, wherein the main heating segment further includes a connector for connecting different arc-shaped heating segments.

14. The heating apparatus according to claim 13, wherein auxiliary heating zones are provided between a plurality of opposite connectors of the main heating segment, the plurality of auxiliary heaters being located within the auxiliary heating zones.

15. The heating apparatus according to claim 14, wherein an area of the auxiliary heating zones is less than ⅕ of an area of the wafer susceptor.

16. The heating apparatus according to claim 1, wherein the plurality of auxiliary heaters include first auxiliary heaters and second auxiliary heaters, distances from the first auxiliary heaters to the rotation axis are greater than distances from the second auxiliary heaters to the rotation axis, and a number of the first auxiliary heaters is greater than or equal to that of the second auxiliary heaters.

17. The heating apparatus according to claim 1, wherein the plurality of auxiliary heaters include first auxiliary heaters and second auxiliary heaters, distances from the first auxiliary heaters to the rotation axis are greater than distances from the second auxiliary heaters to the rotation axis, and heating power of the first auxiliary heaters is greater than or equal to that of the second auxiliary heaters.

18. The heating apparatus according to claim 1, wherein heating power of the main heater is over 15 folds of that of the plurality of auxiliary heaters.

19. The heating apparatus according to claim 1, further comprising:

a main power controller connected to the main heater and an auxiliary power controller connected to the plurality of auxiliary heaters, wherein the main power controller and the auxiliary power controller are configured to control heating power of the main heater and heating power of the plurality of auxiliary heaters, respectively; and a thermal insulative shielding plate provided beneath the heating apparatus, wherein a plurality of auxiliary pin connectors of the plurality of auxiliary heaters pass downward through the thermal insulative shielding plate to be electrically connected to the auxiliary power controller below.

20. MOCVD equipment, comprising:

an airtight reaction chamber;

a wafer susceptor disposed in the airtight reaction chamber and having a rotation axis, configured to securely hold wafers on an upper surface of the wafer susceptor; and a heating apparatus comprising:

a main heater configured to heat the wafer susceptor above; and a plurality of auxiliary heaters, each of the plurality of auxiliary heaters including two auxiliary pin connectors, wherein the plurality of auxiliary heaters are capable of moving along a radial direction of the wafer susceptor or along a direction of a rotation axis; and a thermal insulation portion, wherein the thermal insulation portion surrounds the plurality of auxiliary heaters to transfer heat of the plurality of auxiliary heaters to the wafer susceptor;

wherein the plurality of auxiliary heaters have different distances from the rotation axis, and each of the plurality of auxiliary heaters is configured to independently adjust a local temperature of a zone heated by the main heater;

wherein the heating apparatus is disposed beneath the wafer susceptor and vertically spaced a distance from the wafer susceptor; the heating apparatus is configured to heat the wafer susceptor, and heating powers of the main heater and the plurality of auxiliary heaters are independently controlled.

21. The MOCVD equipment according to claim 20, wherein a thermal insulative shielding plate is provided beneath the heating apparatus, and a liquid cooling conduit is provided beneath the thermal insulative shielding plate such that a cooling zone is formed beneath the thermal insulative shielding plate.

22. Chemical vapor deposition equipment, comprising:

a wafer susceptor having a rotation axis; and a main heater and a plurality of auxiliary heaters, which are disposed beneath the wafer susceptor and vertically spaced a distance from the wafer susceptor, wherein the main heater is configured to heat the wafer susceptor above, wherein different auxiliary heaters have different distances from the rotation axis, and each of the plurality of auxiliary heaters is configured to independently adjusting local temperatures of a zone heated by the main heater;

a thermal insulative shielding plate is provided beneath the main heater and the plurality of auxiliary heaters, a liquid cooling conduit is provided beneath the thermal insulative shielding plate such that a cooling zone is formed beneath the thermal insulative shielding plate; and a thermal insulation portion, wherein the thermal insulation portion surrounds the plurality of auxiliary heaters to transfer heat of the plurality of auxiliary heaters to the wafer susceptor;

each of the plurality of auxiliary heaters includes two auxiliary pin connectors, the two auxiliary pin connectors pass through the thermal insulative shielding plate to the cooling zone below, wherein the plurality of auxiliary heaters are capable of moving along a radial direction of the wafer susceptor or along a direction of a rotation axis.

23. The chemical vapor deposition equipment according to claim 22, wherein when the wafer susceptor is rotating, the plurality of auxiliary heaters are configured to heat the wafer susceptor, forming a plurality of auxiliary ring-shaped heating zones having different distances from the rotation axis, wherein temperatures of the plurality of auxiliary ring-shaped heating zones are independently controllable to adjust local temperatures of the zone heated by the main heater.

24. The chemical vapor deposition equipment according to claim 23, wherein when the wafer susceptor is rotating, vertical projections of arc-shaped heating segments onto the wafer susceptor form a first ring-shaped zone, and vertical projection of at least one of the plurality of auxiliary heaters onto the wafer susceptor at least partially overlaps the first ring-shaped zone.

25. The chemical vapor deposition equipment according to claim 23, wherein when the wafer susceptor is rotating, vertical projections of intervals between adjacent arc-shaped heating segments onto the wafer susceptor form a second ring-shaped zone, and vertical projection of at least one of the plurality of auxiliary heaters onto the wafer susceptor at least partially overlaps the second ring-shaped zone.

* * * * *